United States Patent
Mueller

[11] 3,934,246
[45] Jan. 20, 1976

[54] ALPHANUMERIC DISPLAY MEANS FOR COMPUTER-LINKED TYPEWRITER CONSOLES USING LIGHT-EMITTING DIODES (LED'S) IN CONJUNCTION WITH SETS OF FIBER-OPTIC MATRIX MEMBERS

[75] Inventor: Thomas Delbert Mueller, Orinda, Calif.

[73] Assignee: Chevron Research Company, San Francisco, Calif.

[22] Filed: Nov. 5, 1973

[21] Appl. No.: 413,145

[52] U.S. Cl............ 340/324 R; 340/365 R; 340/380
[51] Int. Cl.² ............................................. G06F 3/14
[58] Field of Search ....... 340/324 R, 324 M, 324 A, 340/324 AD, 380, 365 R, 365 C, 336

[56] References Cited
UNITED STATES PATENTS

| | | | |
|---|---|---|---|
| 3,187,321 | 6/1965 | Kameny | 340/365 R |
| 3,644,922 | 2/1972 | James et al. | 340/380 |
| 3,670,322 | 6/1972 | Mallebrein | 340/365 C |
| 3,786,499 | 1/1974 | Jankowski et al. | 340/380 |

*Primary Examiner*—Marshall M. Curtis
*Attorney, Agent, or Firm*—R. L. Freeland, Jr.; H. D. Messner

[57] ABSTRACT

The present invention relates to an alphanumeric display unit means for improving the identification quantities at selected key buttons of a computer-linked typewriter console through usage of light-emitting indentification indicia attached adjacent to or at the selected key buttons. Each light-emitting display is in matrix format consisting of a set of fiber optic members arranged in orthogonal rows and columns. Encoding is via cooperative drum means including a plurality of rotatable light-emitting diodes (LED's) columnarly aligned at the interior of the drum means for generating a series of light signals for transmission along each set of fiber optic members.

3 Claims, 6 Drawing Figures

U.S. Patent     Jan. 20, 1976     Sheet 1 of 2     3,934,246
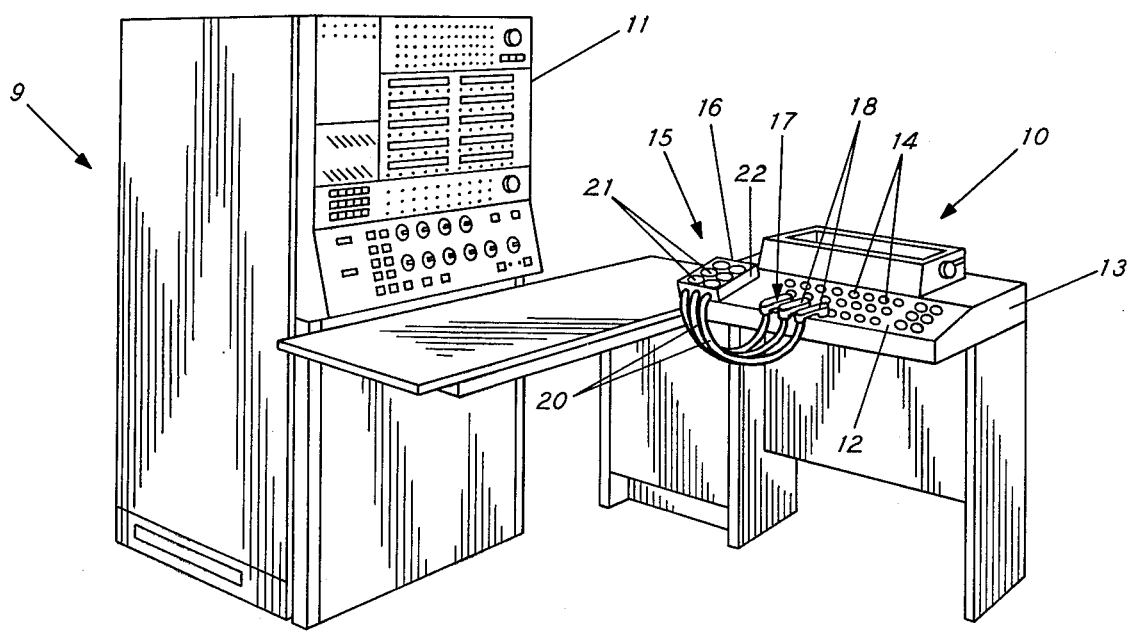
FIG. 1
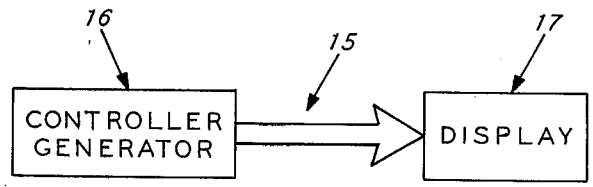
FIG. 2
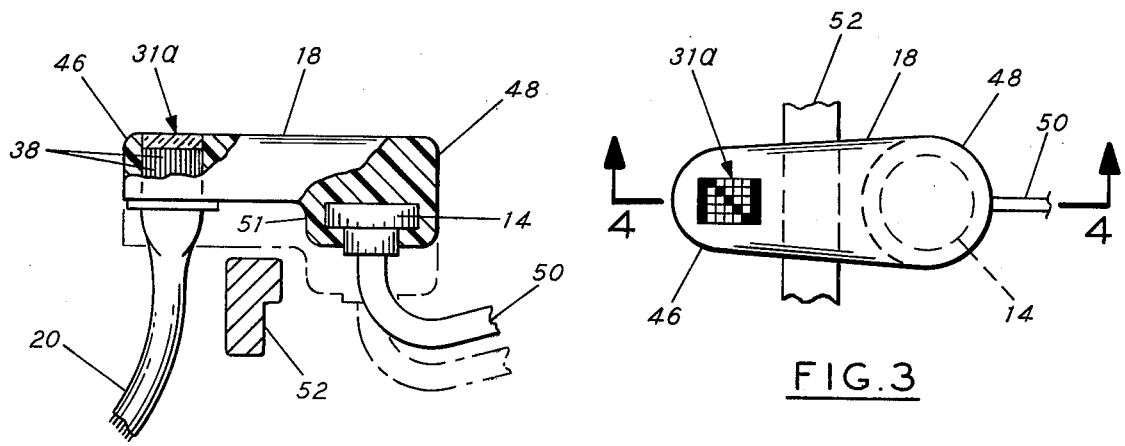
FIG. 3
FIG. 4

ALPHANUMERIC DISPLAY MEANS FOR COMPUTER-LINKED TYPEWRITER CONSOLES USING LIGHT-EMITTING DIODES (LED'S) IN CONJUNCTION WITH SETS OF FIBER-OPTIC MATRIX MEMBERS

FIELD OF THE INVENTION

The present invention relates to key-operated typographical machines such as typewriters and the like, and more particularly, to a computer-linked typewriter console used as an input-output (I/O) linkage for a general purpose digital computer.

BACKGROUND OF THE INVENTION

Today's different programming language (FORTRAN, PL-1, ASSEMBLY, etc.) are often used interchangeably by operators at a common computer terminal for controlling a general purpose digital computer. The number, symbols and programming keys associated with a given programming language may require any one operator to alternate a plurality of fonts at the computer-linked typewriter console; however, as is well known, each font relates to a different layout of keyboard characters.

As font changes occur, it has been proposed to employ key buttons, each bearing a plurality of characters to aid the observer-user in more efficiently using the typewriter console. It has been further proposed to fit the key buttons with adjustable plates bearing different character indicia. However, where there are a plurality of operators-users at a common typewriter console such as found at most computer terminals, numerous alphanumeric identification plates would be needed. Therefore, the above-mentioned proposals have been found to be exceedingly awkward to implement. Also, in some cases it is desirable to "highlight" certain key buttons above those displayed at adjacent buttons owing to the importance of certain programming keys being implemented at the computer terminal. None of the prior art plates provides such features.

SUMMARY OF THE INVENTION

In accordance with the present invention, selected keyboard buttons of an I/O typewriter console linked to a general purpose digital computer are provided with a plurality of tightly fitting rigid tab frame means. Onto the frame means are fitted highly visible, light-emitting alphanumeric display means for display of key alphanumeric indicia through selective control provided by controller switch means connected thereto. Preferably the light-emitting display means includes end array display matrices comprising sets of fiber optic members. Each set is arranged in orthogonal columns and rows. Encoding of data is provided by drum means; i.e., each set of fiber optic members is connected to a side wall of a stationary channeling drum along a column parallel of drum's axis of symmetry in radial alignment with a series of openings ("columnar channeling station"). The openings terminate at the central bore of the stationary drum. The central bore is also large enough to accommodate a rotatable source cylinder supporting a series of light-emitting semiconductor diodes (LED's). To generate a selected alphanumeric display, the LED's are selectively activated as a function of time and angular position of the channeling drum. The source cylinder rotates at a constant rate of speed. Thus, light falls on the sets of selected optic members, in sequence, as angular alignment occurs at each of the channeling stations. As a result of transmission by internal light reflection, the selected alphanumeric display appears—instantaneously—for display at associated display matrices connected to the selected fiber optic members.

OBJECTS OF THE INVENTION

An object of the present invention is the provision of a novel, light-emitting alphanumeric display for use at a typewriter console linked to a general purpose digital computer whereby the observer-user of the typewriter console can easily identify key lever operations irrespective of the number and/or programming language employed within the linked digital computer or at the I/O typewriter console itself.

Further objects of the invention will become apparent from a detailed description of the single embodiment given by way of example and not by way of limitation, reference being made to the accompanying drawings.

DESCRIPTION OF THE DRAWINGS

FIG. 1 is a perspective view of an I/O computer terminal which includes a typewriter console having a keyboard provided with light-emitting, alphanumeric character displays positioned at selected key buttons in accordance with the present invention;

FIG. 2 is a schematic diagram of circuitry useful in the apparatus of the present invention;

FIG. 3 is a plan view of a tab frame means attached to a selected key button of the typewriter console of FIG. 1;

FIG. 4 is a section taken along line 4—4 of FIG. 3.

DESCRIPTION OF A DETAILED EMBODIMENT

Figure 5:
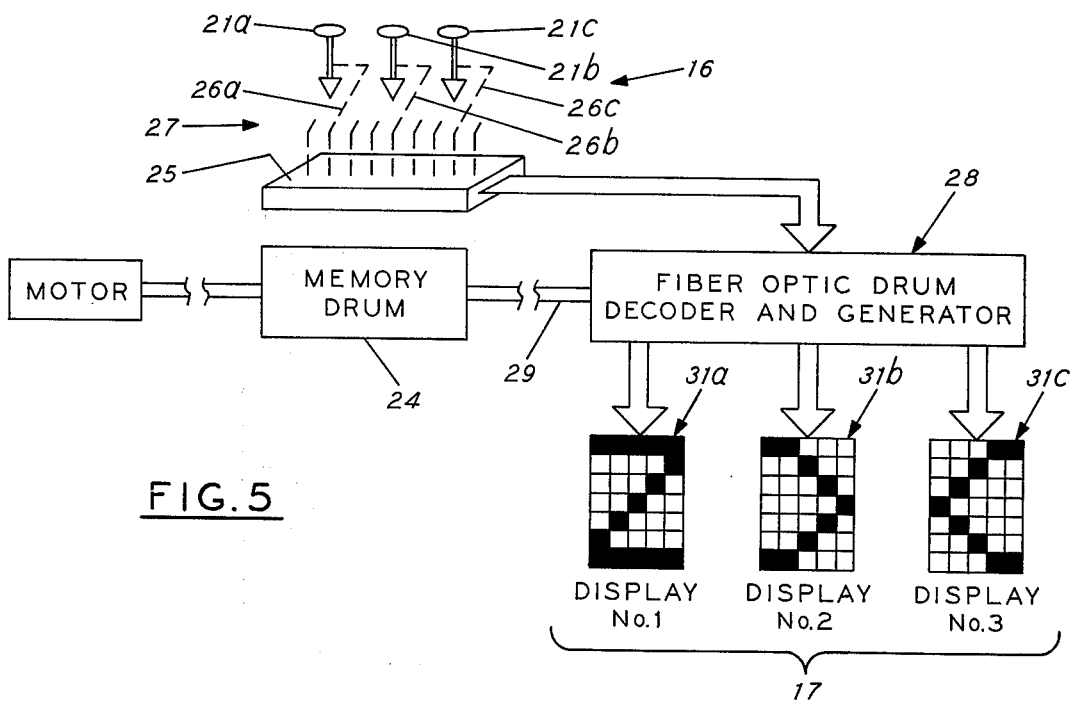
FIG. 5 is a schematic diagram of circuitry useful in providing encoding data for the displays of FIG. 1.

FIG. 1 illustrates a computer terminal 9. The computer terminal 9 includes an I/O typewriter console 10 useful in linking digital information to a general purpose digital computer (not shown). Information can also be linked to the computer by I/O devices other than the typewriter console 10. For this purpose, such associated I/O devices can be housed within cabinet 11.

Typewriter console 10 is seen to comprise a keyboard 12 visible above housing 13. The observer-user utilizers key buttons 14 to depress levers (not shown) by which conventional font-paper interaction occurs while, simultaneously, the data is transmitted, after being compiled, to the general purpose digital computer. Keyboard 12 is conventionally arranged; e.g., as a series of rows and columns. Due to the fact that different programming languages used by various observer-users for computer control purposes may employ numerous characters, symbols and keys not readily interrelated, there is a definite need for identification means for attachment to selected key buttons 14. Preferably such identification means should highlight the display irrespective of the background lighting environment at the computer terminal 9. The present invention provides for such a display through a novel, light-emitting display unit 15 attached to the typewriter console 10. In general, it comprises a controller switch unit 16 attached, say, to the housing 14 of the typewriter console 10, and an alphanumeric indicating unit 17 including a rigid frame means 18. Also of importance: transfer bundle means 20 connected between the controller switch unit 16 and the indicating unit 17. Each of the aforementioned elements will now be described in detail.

Controller Switch Unit 16

FIG. 1 illustrates assembly requirements of the controller switch unit 16; obviously it should be placed within arm's length of an observer-user seated at the typewriter console 10. At the horizontal surface of the unit are a series of buttons 21. Purpose: to effectuate control of light energy being generated within controller switch unit 16 so to provide a selected set of light signals, such light signals being passed in turn via transfer bundle means 20 to the indicating unit 17, see FIG. 2. The buttons 21 are arranged as an array comprising two columns and three rows which extend above support housing 22. Tags are arranged at the broad surfaces of the buttons so as to easily identify the display indicia controlled by a selected button. Operation of the buttons 21 is straightforward; downward movement of a selected button will cause switch elements (not shown) to change their operational state either from an active to an inactive one or vice versa. As a result, initialization operations within the controller switch unit 16 occur, as discussed below.

Figure 6:
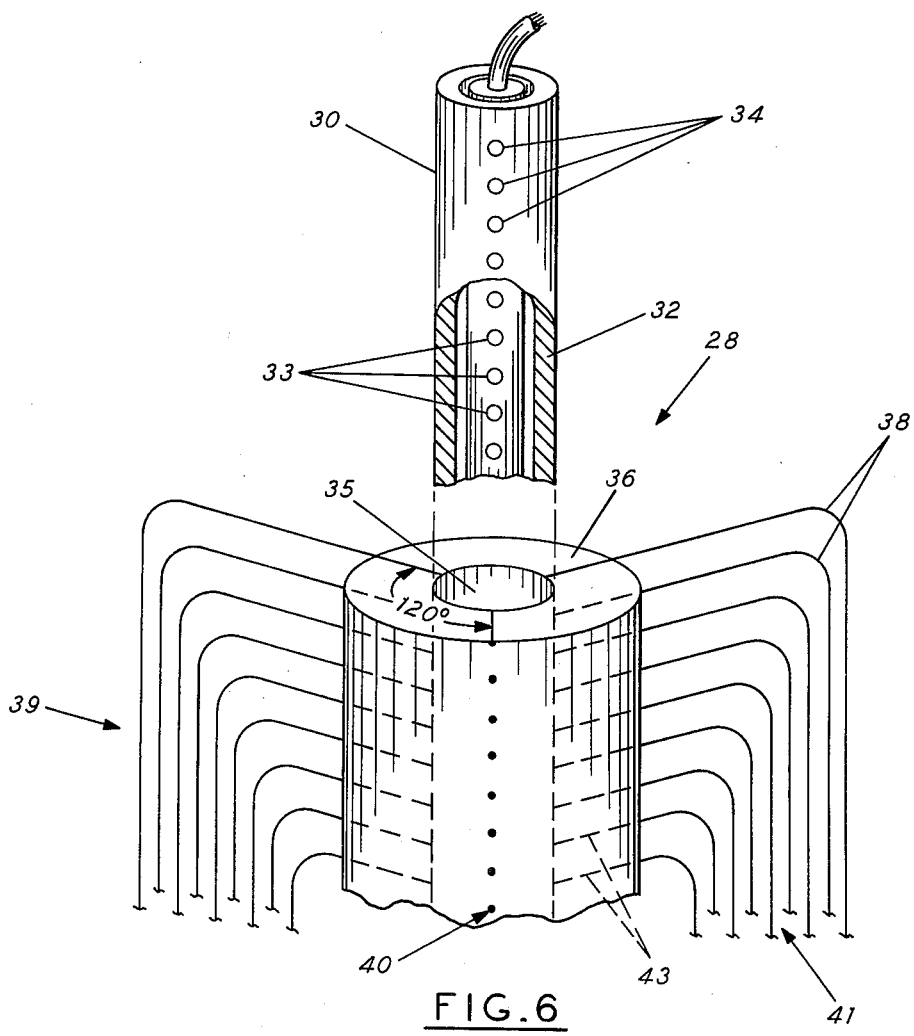
FIG. 6 is a partially schematic view of a drum encoding means useful in the circuit of FIG. 5.

FIGS. 5 and 6 illustrate, in detail, the controller switch unit 16.

As shown in FIG. 5, assume binary control-bit data has been encoded onto memory drum 24 as bit-channels, say under activation of selected buttons 21a, 21b and 21c through read-write head unit 25 adjacent to the memory drum 24. As previously discussed, downward movement of the buttons is linked, as through mechanical linkages such as 26a, 26b and 26c to a series of switch elements generally indicated at 27 supported within read-write head unit 25. As a result, sets of binary activation codes are fed into fiber-optic drum decoder-generator drum means 28 via transfer line 29. Purpose: to provide the fiber-optic decoder-generator drum means 28 with sufficient control information by which light signals can be generated for display at display array matrices 31a, 31b and 31c constituting the indicating unit 17, as explained below.

FIG. 6 illustrates fiber optic decoder-generator drum means 28 in more detail.

As shown, the drum means 28 includes a source cylinder 30 rotating interior of stationary channel drum 36. Source cylinder 30 has a central bore 32. Within the bore 32 are a series of light-emitting semiconductor diodes 33 (LED's) fixed with respect to columnar, radial openings 34. Openings 34 are seen to extend through the side wall of the source cylinder 30 parallel of its axis of rotation. In that way, as the LED's 33 are selectively activated through switch buttons 21a, 21b and 21c of FIG. 5 in conjunction with operations of read-write head unit 25, a series of light signals are generated. Such signals then pass to the interior bore 35 of the stationary channel drum 36.

Light emission properties of LED's 33 are well known and need not be discussed in detail. Suffice to say that optimum light-emitting diode materials include gallium arsenide, gallium phosphide, and mixed crystals of these two compounds. Likewise the carrier substrate may be of any suitable material or materials if the latter permit monocrystalline epitaxial growth; e.g., a composite of semiconductors, metals or insulating materials may be desirable in this regard.

Since the channel drum 36 is stationary as previously mentioned, the exterior thereof can be fitted with sets of light-conducting fiber optic members 38 schematically illustrated at constituting the transfer bundle means 20 of FIG. 1. Preferably these members 38 are aligned in a series of columnar stations parallel to the axis of symmetry of the drum 36. The stations channel light entering the drum 36 via openings 43, onto each set of fiber optic members 38, in sequence. There, of course, can be more than two channel stations at the exterior surface of the drum 36: for example, three such stations are indicated at 39, 40 and 41 in FIG. 6 to match the number of display matrix arrays which constitute the indicating unit 17 of FIG. 1.

In addition to having axial alignment between each columnar set of light-conducting fiber optic members 38 and the series of radial openings 43 extending through the side wall of the channel drum 36, there is a corresponding requirement that the latter be equal in number to the number of LED's 33 within the source cylinder 30.

In operation, the source light cylinder 30 is rotated at a selected speed, say 60 revolutions per second, well above the known flicker fusion frequency of the human eye— 30 cycles per second. LED's 33 are then activated as a function of time and angular position of the cylinder 30. Result: the alphanumeric indicia produced at each of the displays 31a, 31b or 31c (FIG. 5) appears as a solid image to the human observer-user even though the activation codes may be repetitive in nature.

Synchronization of the rotation of the memory drum and source cylinder, of course, is necessary so that each of the channeling stations can be correctly positioned with respect to the LED's 33 as activation of the latter occurs. In this regard, a timing signal generated during each rotation of the source cylinder 30 can be used to produce a synchronization signal for synchronizing rotation of both. Also, it should be noted that at each channeling station, even though the fiber optic members 38 are columnarly aligned, they can be sequentially scanned so as to provide a matrix output at the array matrix displays 31a, 31b and 31c of FIG. 5. The visible light thus generated (4,000 to 13,000 A.) ad subsequently transferred to these displays, results in a pattern of light corresponding to the alphanumeric indicia for which display is sought at the indicating unit 17.

Indicating Unit 17

Indicating unit 17 is illustrated in detail in FIGS. 3 and 4.

As previously described, transfer bundle means 20 is composed of bundles ("sets") of light-conducting members 38, and these light-conducting members 38 terminate at the indicating unit 17 of FIG. 2. One of the plurality of display array matrices comprising the indicating unit 17 is indicated in detail at 31a in FIGS. 3 and 4, and is seen to be supported via the rigid frame means 18 previously mentioned. The frame means 18 includes a cantilevered end 46 and a support end 48. The support end 48 attaches to a selected key button 14 as shown in FIG. 4. Over the central region of the frame means 18 there is a reduction in thickness to form a step 51. In that way when the keyboard button 14 is depressed whereby key lever 50 is likewise downwardly depressed, there is sufficient clearance of these elements with regard to lip 52 of the typewriter housing.

The display matrix 31a is seen in FIG. 3 to be conventionally arranged. Its matrix format is composed of sets of orthogonal rows and columns of sufficient size to display the alphanumerical indicia of interest, say in a 7 × 5 matrix. Since the generated alphanumeric display at each display matrix is illuminated by light, the observer-user can easily observe the displayed indicia irrespective of the background lighting at the computer terminal.

While certain preferred embodiments of the invention have been specifically disclosed, it should be understood that the invention is not limited thereto. For example, if the dimensions of the fiber optic display matrix 31a are reduced, the supporting housing within each key button 14 may be sufficient to support the former. In such an arrangement, a selected key button 14 would be provided with a bore which would then accept a display array matrix. The resulting end array of fiber optic members would be directly viewable by the observer-user. Accordingly, as many variations will be readily apparent by those skilled in the art, the invention should be given as broad as possible interpretation in terms of the following claims.

I claim:

1. A device for displaying alphanumeric light-emanating indicia at selected key buttons of a keyboard of a typewriter console forming an I/O link with a general purpose digital computer, each light-emanating alphanumeric indicium being related to a font operational characteristic resulting from movement of one of said selected key buttons under control of a human observer-user whereby said font operational characteristic is permanently recorded on paper at said typewriter console in full view of said human observer-user through mechanical button-font-paper interaction, comprising
   a. an array of sets of fiber optic, light-conducting members having near ends arranged to display at or adjacent to at least one of said selected key buttons said light-emanating alphanumeric indicium associated with said font operational characteristic;
   b. elongated rigid cantilevered frame means attached to and supportive of said near ends of said sets of fiber optic, light-conducting members, said frame means including cooperative support means in gripping contact with a corresponding key button of said keyboard;
   c. a set of light-emitting diodes (LED's) positioned at opposite ends of said sets of fiber optic, light-conducting members, and
   d. encoding means operatively connected to said sets of fiber optic members for controlling passage of light therealong and including cooperative drum means for aiding in the controlled generation of a series of encoded light signals corresponding to said alphanumeric indicium for which display is sought, said indicium being of sufficient intensity so as to be easily discernible to said human observer-user using said typewriter console irrespective of the background lighting environment thereabout.

2. In a device for displaying alphanumeric indicia at selected keys of a keyboard of a typewriter console forming an I/O link with a general purpose computer, each indicium being related to a font operational characteristic resulting from depression of a selected key button under control of a human observer-user whereby said font operational characteristic is permanently recorded on paper at said typewriter console in full view of said human observer-user through mechanical button-font paper interaction, the improvement comprising
   a. an array of sets of fiber optic, light-conducting members arranged with near ends viewable by said human observer-user to display said selected alphanumeric indicium adjacent to or at said selected key button, said displayed indicium being of sufficient light-emanating intensity as to be easily discernible by said observer-user irrespective of background lighting environment thereabout;
   b. encoding-decoding means selectively connected to light-emitting-diodes (LED's) positioned at remote ends of said sets of light-conducting members including cooperative drum means for repetitively generating a series of encoded light signals corresponding to said alphanumeric display indicium for which display is sought, said light signals being viewable at said near ends of said set of fiber optic members at a rate above the flicker frequency of the human eye whereby a solid image thereof is generated, said encoding-decoding means being optical-mechanical and including rotating source means comprising a columnar set of said light-emitting diodes (LED's) rotating about an axis of rotation at a rate above said flicker fusion frequency of the human eye, said LED's being individually activated in accordance with a selected binary activation code; and stationary channeling drum means having a central bore into which said rotatable LED's are positioned, said channeling drum also including a side wall fitted to sets of columnar openings radially terminating at a series of channeling stations circumferentially spaced about the exterior surface of said drum, each channeling station being connected to one of said sets of said fiber optic light-conducting members whereby said encoded light signals from said LED's appear repetitively at said near ends thereof to provide said alphanumeric indicium of interest.

3. Device of claim 1 in which said end array of sets of fiber optic, light-emanating members is supported interior of said one key button of said keyboard, said array being viewable at the finger-touching surface of said one key button.

* * * * *